(12) United States Patent
Howard et al.

(10) Patent No.: US 9,768,107 B2
(45) Date of Patent: Sep. 19, 2017

(54) METHOD OF PROVIDING A FLEXIBLE SEMICONDUCTOR DEVICE AND FLEXIBLE SEMICONDUCTOR DEVICE THEREOF

(71) Applicants: Emmett Howard, Tempe, AZ (US); Nicholas Munizza, Gilbert, AZ (US); Paul Yee, Chandler, AZ (US)

(72) Inventors: Emmett Howard, Tempe, AZ (US); Nicholas Munizza, Gilbert, AZ (US); Paul Yee, Chandler, AZ (US)

(73) Assignee: ARIZONA BOARD OF REGENTS, A BODY CORPORATE OF THE STATE OF ARIZONA, ACTING FOR AND ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 15/217,405

(22) Filed: Jul. 22, 2016

(65) Prior Publication Data
US 2016/0329268 A1    Nov. 10, 2016

Related U.S. Application Data

(63) Continuation of application No. PCT/US2015/012717, filed on Jan. 23, 2015.
(Continued)

(51) Int. Cl.
*H01L 21/58* (2006.01)
*H01L 23/498* (2006.01)
(Continued)

(52) U.S. Cl.
CPC ...... *H01L 23/4985* (2013.01); *H01L 21/4853* (2013.01); *H01L 21/6835* (2013.01);
(Continued)

(58) Field of Classification Search
CPC .. H01L 21/2007; H01L 21/52; H01L 51/0097
(Continued)

(56) References Cited

U.S. PATENT DOCUMENTS

| 3,089,801 A | 5/1963 | Tierney et al. |
| 3,684,637 A | 8/1972 | Andersen et al. |

(Continued)

FOREIGN PATENT DOCUMENTS

| CN | 1332599 | 1/2002 |
| CN | 1118075 | 8/2003 |

(Continued)

OTHER PUBLICATIONS

R. Lujan and R. A. Street, Oxide TFTs for a flexible x-ray image sensor. Palo Alto Research Center. Flex Tech Alliance Presents: Metal Oxide TFT Devices and Technology Workshop (Jul. 2012).
(Continued)

*Primary Examiner* — George Fourson, III
(74) *Attorney, Agent, or Firm* — Bryan Cave LLP

(57) ABSTRACT

Some embodiments include a method. The method can include providing a carrier substrate, providing a release layer over the carrier substrate, and providing a device substrate over the carrier substrate and the release layer. Providing the device substrate can include bonding the device substrate to the carrier substrate, and bonding the device substrate to the release layer. Further, providing the release layer can include bonding the release layer to the carrier substrate. Meanwhile, the release layer can include polymethylmethacrylate, and the device substrate can be bonded to the carrier substrate with a first adhesion strength, the device substrate can be bonded to the release layer with a second adhesion strength less than the first adhesion strength, and the release layer can be bonded to the carrier substrate with a third adhesion strength greater than the
(Continued)

second adhesion strength. Other embodiments of related methods and devices are also disclosed.

20 Claims, 12 Drawing Sheets

Related U.S. Application Data

(60) Provisional application No. 61/930,853, filed on Jan. 23, 2014.

(51) Int. Cl.
*H01L 21/683* (2006.01)
*H01L 21/48* (2006.01)
*H01L 21/52* (2006.01)
*H01L 21/20* (2006.01)
*H01L 51/00* (2006.01)

(52) U.S. Cl.
CPC .......... *H01L 21/2007* (2013.01); *H01L 21/52* (2013.01); *H01L 51/0097* (2013.01); *H01L 2221/6835* (2013.01); *H01L 2221/68318* (2013.01); *H01L 2221/68381* (2013.01); *H01L 2221/68386* (2013.01)

(58) Field of Classification Search
USPC .................................. 257/99, 702; 438/118
See application file for complete search history.

(56) References Cited

U.S. PATENT DOCUMENTS

| | | |
|---|---|---|
| 3,723,635 A | 3/1973 | Smith |
| 4,337,107 A | 6/1982 | Eshleman |
| 4,349,593 A | 9/1982 | Blechstein |
| 4,489,487 A | 12/1984 | Bura |
| 4,858,073 A | 8/1989 | Gregory |
| 5,098,772 A | 3/1992 | af Strom |
| 5,117,114 A | 5/1992 | Street et al. |
| 5,220,488 A | 6/1993 | Denes |
| 5,229,882 A | 7/1993 | Rowland |
| 5,252,383 A | 10/1993 | Fukutake et al. |
| 5,264,063 A | 11/1993 | Martin |
| 5,292,686 A | 3/1994 | Riley et al. |
| 5,453,157 A | 9/1995 | Jeng |
| 5,702,980 A | 12/1997 | Yu et al. |
| 5,714,305 A | 2/1998 | Teng et al. |
| 5,842,722 A | 12/1998 | Carlson |
| 5,853,511 A | 12/1998 | Fairbanks |
| 5,861,470 A | 1/1999 | Voss et al. |
| 5,869,150 A | 2/1999 | Iwamoto |
| 5,890,429 A | 4/1999 | Alam et al. |
| 5,916,652 A | 6/1999 | Miner et al. |
| 6,051,169 A | 4/2000 | Brown et al. |
| 6,051,508 A | 4/2000 | Takase et al. |
| 6,083,580 A | 7/2000 | Finestone et al. |
| 6,177,163 B1 | 1/2001 | Blok et al. |
| 6,358,832 B1 | 3/2002 | Edelstein et al. |
| 6,482,288 B1 | 11/2002 | Kreckel et al. |
| 6,531,389 B1 | 3/2003 | Shue et al. |
| 6,541,398 B2 | 4/2003 | Grill et al. |
| 6,580,035 B1 | 6/2003 | Chung |
| 6,627,037 B1 | 9/2003 | Kurokawa et al. |
| 6,630,289 B1 | 10/2003 | Kwok et al. |
| 6,632,746 B2 | 10/2003 | Kanegae et al. |
| 6,670,265 B2 | 12/2003 | Wang et al. |
| 6,746,969 B2 | 6/2004 | Shimada et al. |
| 6,752,160 B2 | 6/2004 | Chen |
| 6,808,773 B2 | 10/2004 | Shimamura et al. |
| 6,825,068 B2 | 11/2004 | Denis et al. |
| 6,856,670 B2 | 2/2005 | Hoheisel |
| 7,212,088 B1 | 5/2007 | Norregaard et al. |
| 7,316,942 B2 | 1/2008 | Sarma et al. |
| 7,329,601 B2 | 2/2008 | Miyajima |
| 7,344,993 B2 | 3/2008 | Balasubramaniam et al. |
| 7,375,341 B1 | 5/2008 | Nagarkar et al. |
| 7,385,224 B2 | 6/2008 | Ishii et al. |
| 7,481,901 B2 | 1/2009 | Toyoda et al. |
| 7,538,038 B2 | 5/2009 | Matsushita et al. |
| 7,563,026 B2 | 7/2009 | Mandelkern et al. |
| 7,795,006 B2 | 9/2010 | Nagino et al. |
| 7,838,328 B2 | 11/2010 | Isa |
| 7,906,193 B2 | 3/2011 | Yukawa et al. |
| 8,038,820 B2 | 10/2011 | Kim et al. |
| 8,048,251 B2 | 11/2011 | Yamashita et al. |
| 8,383,520 B2 | 2/2013 | Marrs |
| 8,481,859 B2 | 7/2013 | Haq et al. |
| 8,992,712 B2 | 3/2015 | Loy et al. |
| 8,999,778 B2 | 4/2015 | O'Rourke et al. |
| 9,076,822 B2 | 7/2015 | Loy et al. |
| 9,155,190 B2 | 10/2015 | Haq et al. |
| 9,507,011 B2 | 11/2016 | Zhang et al. |
| 9,601,530 B2 | 3/2017 | Marrs |
| 2002/0008839 A1 | 1/2002 | Miyai et al. |
| 2002/0018173 A1 | 2/2002 | Furukawa et al. |
| 2002/0081863 A1 | 6/2002 | Shimada et al. |
| 2003/0031296 A1 | 2/2003 | Hoheisel |
| 2003/0069331 A1 | 4/2003 | Teiichi et al. |
| 2003/0072889 A1 | 4/2003 | Abrams |
| 2003/0201465 A1 | 10/2003 | Ryuzaki et al. |
| 2004/0008298 A1 | 1/2004 | Kwok et al. |
| 2004/0110326 A1 | 6/2004 | Forbes et al. |
| 2005/0186801 A1 | 8/2005 | Uno et al. |
| 2005/0221542 A1 | 10/2005 | Yamazaki et al. |
| 2005/0221599 A1 | 10/2005 | Kanegae et al. |
| 2005/0233583 A1 | 10/2005 | Miyajima |
| 2005/0242341 A1 | 11/2005 | Knudson et al. |
| 2006/0017154 A1 | 1/2006 | Eguchi et al. |
| 2006/0019491 A1 | 1/2006 | Soda |
| 2006/0148141 A1 | 7/2006 | Seo et al. |
| 2006/0169485 A1 | 8/2006 | Kawaguchi et al. |
| 2006/0180815 A1 | 8/2006 | Sarma et al. |
| 2006/0192229 A1 | 8/2006 | Kato et al. |
| 2006/0194363 A1 | 8/2006 | Giesberg et al. |
| 2006/0207967 A1 | 9/2006 | Bocko et al. |
| 2006/0223282 A1 | 10/2006 | Amundson et al. |
| 2007/0042140 A1 | 2/2007 | af Strom |
| 2007/0054440 A1 | 3/2007 | Hu |
| 2007/0241436 A1 | 10/2007 | Ookubo et al. |
| 2008/0038885 A1 | 2/2008 | Lee et al. |
| 2008/0050548 A1 | 2/2008 | Abrams |
| 2008/0090338 A1 | 4/2008 | Tredwell et al. |
| 2008/0105877 A1 | 5/2008 | Yamazaki et al. |
| 2008/0122121 A1 | 5/2008 | Suda et al. |
| 2008/0179594 A1 | 7/2008 | Oh |
| 2008/0224243 A1 | 9/2008 | Lee |
| 2008/0315252 A1 | 12/2008 | Shim |
| 2009/0004419 A1 | 1/2009 | Cok et al. |
| 2009/0008132 A1 | 1/2009 | Takasawa et al. |
| 2009/0072122 A1 | 3/2009 | Tada et al. |
| 2009/0101903 A1 | 4/2009 | Chen et al. |
| 2009/0134390 A1 | 5/2009 | Kodama et al. |
| 2009/0176039 A1 | 7/2009 | af Strom |
| 2009/0202857 A1 | 8/2009 | Kerr et al. |
| 2009/0211791 A1 | 8/2009 | Tredwell et al. |
| 2009/0229874 A1 | 9/2009 | Katagiri et al. |
| 2009/0269874 A1 | 10/2009 | Huang et al. |
| 2009/0294767 A1 | 12/2009 | Lujan et al. |
| 2009/0296754 A1 | 12/2009 | Ledentsov et al. |
| 2010/0003512 A1 | 1/2010 | Ookubo et al. |
| 2010/0003513 A1 | 1/2010 | Ookubo et al. |
| 2010/0025675 A1 | 2/2010 | Yamazaki et al. |
| 2010/0038023 A1 | 2/2010 | Kho et al. |
| 2010/0051189 A1 | 3/2010 | Kawabata et al. |
| 2010/0059171 A1 | 3/2010 | Chun |
| 2010/0059747 A1 | 3/2010 | Nakayama et al. |
| 2010/0123131 A1 | 5/2010 | Tokunaga |
| 2010/0140807 A1 | 6/2010 | Kobayashi et al. |
| 2010/0154992 A1 | 6/2010 | Feinstein et al. |
| 2010/0155694 A1 | 6/2010 | Miller et al. |
| 2010/0183872 A1 | 7/2010 | Nonaka et al. |
| 2010/0203296 A1 | 8/2010 | Tsai et al. |
| 2010/0219410 A1 | 9/2010 | Godo et al. |

(56) References Cited

U.S. PATENT DOCUMENTS

| | | |
|---|---|---|
| 2010/0267203 A1 | 10/2010 | Chen et al. |
| 2010/0295161 A1 | 11/2010 | Koduri |
| 2010/0330748 A1 | 12/2010 | Chu et al. |
| 2011/0003442 A1 | 1/2011 | Wang et al. |
| 2011/0048611 A1 | 3/2011 | Carre et al. |
| 2011/0064953 A1 | 3/2011 | O'Rourke et al. |
| 2011/0069467 A1 | 3/2011 | Flaim et al. |
| 2011/0111194 A1 | 5/2011 | Carre et al. |
| 2011/0141076 A1 | 6/2011 | Fukuhara et al. |
| 2011/0141476 A1 | 6/2011 | Schmaelzle et al. |
| 2011/0227203 A1 | 9/2011 | Marrs |
| 2011/0228492 A1 | 9/2011 | Haq et al. |
| 2011/0230047 A1 | 9/2011 | Marrs |
| 2011/0240988 A1 | 10/2011 | Yano |
| 2011/0303442 A1* | 12/2011 | Chen .................. H05K 3/0058 174/255 |
| 2011/0308724 A1* | 12/2011 | Ait-Mani .................. C09J 5/00 156/295 |
| 2011/0316059 A1* | 12/2011 | Ahn .................. H01L 21/28291 257/295 |
| 2011/0318544 A1 | 12/2011 | Chen et al. |
| 2012/0061672 A1 | 3/2012 | O'Rourke et al. |
| 2012/0107978 A1 | 5/2012 | Shin et al. |
| 2012/0146713 A1 | 6/2012 | Kim et al. |
| 2012/0164408 A1 | 6/2012 | Hwu et al. |
| 2012/0168836 A1 | 7/2012 | Lee et al. |
| 2012/0300419 A1 | 11/2012 | Tang et al. |
| 2012/0329249 A1 | 12/2012 | Ahn et al. |
| 2013/0075739 A1 | 3/2013 | Loy et al. |
| 2013/0077033 A1* | 3/2013 | Li .................. G02F 1/1333 349/122 |
| 2013/0099358 A1* | 4/2013 | Elolampi .................. H01L 23/13 257/618 |
| 2013/0123882 A1 | 5/2013 | Towe |
| 2013/0271930 A1 | 10/2013 | Haq et al. |
| 2014/0008651 A1 | 1/2014 | Marrs |
| 2014/0065389 A1 | 3/2014 | Loy et al. |
| 2014/0254113 A1 | 9/2014 | Howard |
| 2014/0274166 A1 | 9/2014 | Zhang et al. |
| 2014/0340857 A1 | 11/2014 | Hsu et al. |
| 2015/0064385 A1 | 3/2015 | Flaim et al. |
| 2015/0097301 A1 | 4/2015 | Gandhi |
| 2015/0162275 A1* | 6/2015 | Jow .................. H01L 24/97 257/782 |
| 2015/0162392 A1 | 6/2015 | Lim et al. |
| 2015/0231858 A1* | 8/2015 | van Neer .................. B32B 7/12 428/201 |
| 2015/0348921 A1* | 12/2015 | Ganitzer .................. H01L 24/03 438/462 |
| 2016/0003953 A1 | 1/2016 | Kunnen et al. |
| 2016/0005170 A1 | 1/2016 | Thiagarajan et al. |
| 2016/0005183 A1 | 1/2016 | Thiagarajan et al. |
| 2016/0037294 A1 | 2/2016 | Zhang et al. |
| 2016/0144608 A1* | 5/2016 | Chang .................. B32B 37/12 216/83 |
| 2016/0181182 A1 | 6/2016 | Smith et al. |
| 2016/0181288 A1 | 6/2016 | Smith et al. |
| 2016/0225653 A1 | 8/2016 | Marrs |
| 2016/0245689 A1 | 8/2016 | Smith et al. |
| 2016/0252632 A1 | 9/2016 | Smith et al. |
| 2016/0260765 A1 | 9/2016 | Marrs |
| 2016/0260768 A1 | 9/2016 | Smith |
| 2017/0062380 A1 | 3/2017 | Howard et al. |

FOREIGN PATENT DOCUMENTS

| | | |
|---|---|---|
| CN | 1454122 | 11/2003 |
| CN | 101231972 | 7/2007 |
| CN | 101288348 | 10/2008 |
| CN | 103531442 | 1/2014 |
| JP | 01198094 | 8/1989 |
| JP | 07022795 | 1/1995 |
| JP | 08148814 | 6/1996 |
| JP | 11340462 | 10/1999 |
| JP | 2000338454 | 12/2000 |
| JP | 2004311912 | 11/2004 |
| JP | 2004323543 | 11/2004 |
| JP | 2005123576 | 12/2005 |
| JP | 2007073559 | 3/2007 |
| JP | 2007123861 | 5/2007 |
| JP | 2007146121 | 6/2007 |
| JP | 200971057 | 4/2009 |
| JP | 2010067849 | 3/2010 |
| JP | 2010226101 | 10/2010 |
| JP | 2012212939 | 11/2012 |
| KR | 20070103050 | 10/2007 |
| KR | 100810708 | 3/2008 |
| KR | 1020090098033 | 9/2009 |
| KR | 102010007703 | 1/2010 |
| KR | 1020100043654 | 4/2010 |
| KR | 1020130086807 | 8/2013 |
| NO | 2006088564 | 8/2006 |
| WO | 9852391 | 11/1998 |
| WO | 2007083906 | 7/2007 |
| WO | 2007108659 | 9/2007 |
| WO | 2008005979 | 1/2008 |
| WO | 2010051106 | 5/2010 |
| WO | 2010065457 | 6/2010 |
| WO | 2010065459 | 6/2010 |
| WO | 2010065542 | 6/2010 |
| WO | 2010138811 | 12/2010 |
| WO | 2012021196 | 2/2012 |
| WO | 2012021197 | 2/2012 |
| WO | 2012138903 | 10/2012 |
| WO | 2013082138 | 6/2013 |
| WO | 2014039693 | 3/2014 |
| WO | 2014039698 | 3/2014 |
| WO | 2014054949 | 4/2014 |
| WO | 2014152919 | 9/2014 |
| WO | 2014152929 | 9/2014 |
| WO | 2014165149 | 10/2014 |
| WO | 2015057719 | 4/2015 |
| WO | 2015058523 | 4/2015 |
| WO | 2015069566 | 5/2015 |
| WO | WO2015069567 | 5/2015 |
| WO | WO2015175353 | 11/2015 |
| WO | WO2017030632 | 2/2017 |
| WO | 2017034644 | 3/2017 |
| WO | 2017034645 | 3/2017 |

OTHER PUBLICATIONS

R. A. Street, W. S. Wong, T. Ng & R. Lujan. Amorphous silicon thin film transistor image sensors, Philosophical Magazine, 89:28-30, 2687-2697 (Oct. 2009).

J. C. Park, S. Kim, S. Kim, C. Kim, I. Song, Y. Park, U. Jung, D. H. Kim, and J. Lee. Highly Stable Transparent Amorphous Oxide Semiconductor Thin-Film Transistors Having Double-Stacked Active Layers. Adv. Mater. 2010, 22, 5512-5516 (Oct. 22, 2010).

R. A. Lujan and R. A. Street. Flexible X-Ray Detector Array Fabricated With Oxide Thin-Film Transistors. IEEE Electron Device Letters, vol. 33, No. 5 (May 2012).

International Search Report and Written Opinion from related International Patent Application No. PCT/US2014/060501, dated Jan. 19, 2015, 14 pages.

International Search Report and Written Opinion from related International Patent Application No. PCT/US2013/058284, dated Dec. 26, 2013, 12 pages.

International Search Report and Written Opinion from related International Patent Application No. PCT/US2013/058293, dated Dec. 26, 2013, 12 pages.

International Search Report and Written Opinion from related International Patent Application No. PCT/US2012/066833, dated Jan. 17, 2013, 11 pages.

International Search Report and Written Opinion from related International Patent Application No. PCT/US2015/029991, dated Jul. 31, 2015, 13 pages.

International Search Report and Written Opinion from related International Patent Application No. PCT/US2011/037226, dated Feb. 21, 2012, 10 pages.

(56) References Cited

OTHER PUBLICATIONS

International Search Report and Written Opinion from related International Patent Application No. PCT/US2009/066114 dated Mar. 9, 2010, 8 pages.
International Search Report and Written Opinion from related International Patent Application No. PCT/US2012/032388 dated Dec. 10, 2012, 10 pages.
International Search Report and Written Opinion from related International Patent Application No. PCT/US2010/036569, dated Dec. 27, 2012, 11 pages.
International Search Report and Written Opinion from related International Patent Application No. PCT/US2009/066259 dated May 5, 2010, 8 pages.
International Search Report and Written Opinion from related International Patent Application No. PCT/US2009/066111 dated Oct. 25, 2010, 7 pages.
International Search Report and Written Opinion for PCT Application No. PCT/US2011/037207, 11 pages, Feb. 21, 2012.
International Search Report and Written Opinion for PCT/US2016/036505, dated Mar. 17, 2017.
International Search Report and Written Opinion for PCT/US2016/036502, dated Mar. 6, 2017.

\* cited by examiner

103

| Performing an edge bead removal with a solvent to remove the release layer edge portion of the release layer from over the carrier substrate | — 501 |

↓

| Performing an edge bead removal by reactive ion etching the release layer edge portion of the release layer from over the carrier substrate | — 502 |

FIG. 5

METHOD OF PROVIDING A FLEXIBLE SEMICONDUCTOR DEVICE AND FLEXIBLE SEMICONDUCTOR DEVICE THEREOF

CROSS-REFERENCE TO RELATED APPLICATIONS

This application is a continuation of International Patent Application Ser. No. PCT/US2015/012717, filed Jan. 23, 2015. International Patent Application Ser. No. PCT/US2015/012717 claims the benefit of U.S. Provisional Patent Application Ser. No. 61/930,853, filed Jan. 23, 2014. International Patent Application Ser. No. PCT/US2015/012717 and U.S. Provisional Patent Application Ser. No. 61/930,853, filed Jan. 23, 2014 each are incorporated herein by reference in their entirety.

STATEMENT REGARDING FEDERALLY SPONSORED RESEARCH OR DEVELOPMENT

This invention was made with government support under W911NF-04-2-0005 awarded by the Army Research Office. The government has certain rights in the invention.

FIELD OF THE INVENTION

This invention relates generally to processing semiconductors on flexible substrates, and relates more particularly to processing semiconductors on flexible substrates at high temperatures and the semiconductor devices therefrom.

DESCRIPTION OF THE BACKGROUND

In the electronics industry, flexible substrates are quickly becoming popular as a base for electronic circuits. Flexible substrates can include a wide variety of materials, such as, for example, any of a myriad of plastics, metal foils, and glasses (e.g., Corning® glass, Willow™ glass, etc.). Once a desired electronic component, circuit, or circuits are formed over a surface of the flexible substrate, the flexible substrate can be attached to a final product or incorporated into a further structure. Typical examples of such products or structures are active matrices on flat panel displays, RFID (radio-frequency identification) tags on various commercial products in retail stores, a variety of sensors, etc.

A need exists in the art to develop a process for fabricating semiconductor devices on flexible substrates that allows for improved electrical characteristics, such as, for example, improved parametric characteristics and/or lifetime, and reduced bowing, warping, and/or distortion.

BRIEF DESCRIPTION OF THE DRAWINGS

To facilitate further description of the embodiments, the following drawings are provided in which:

FIG. 5 illustrates an exemplary activity of removing a release layer edge portion of the release layer from over the carrier substrate, according to the embodiment of FIG. 1;

Figure 1:
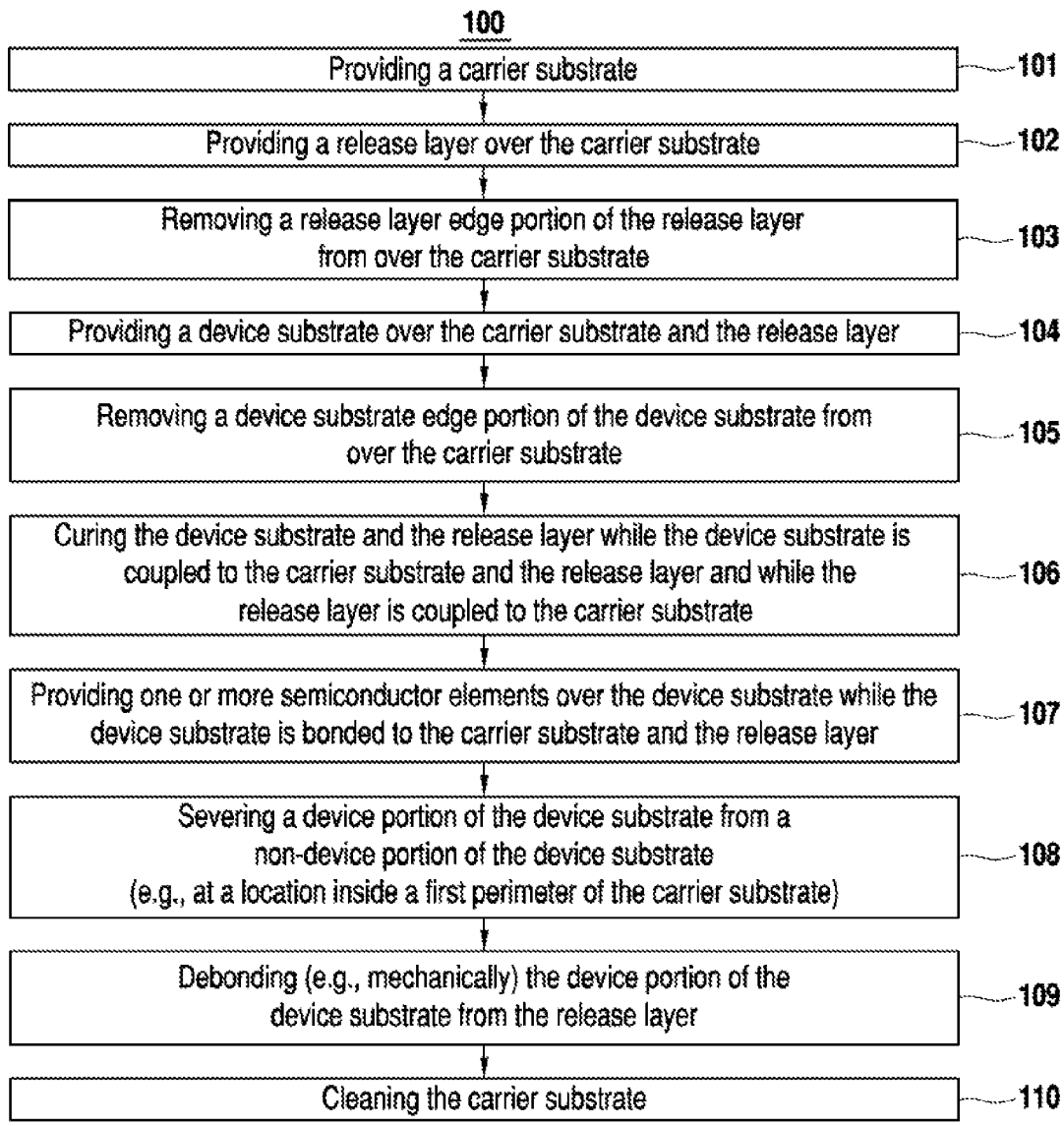
FIG. 1 illustrates a flow chart for an embodiment of a method of providing a semiconductor device.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable.

The term "bowing" as used herein means the curvature of a substrate about a median plane, which is parallel to the top and bottom sides, or major surfaces of the substrate. The term "warping" as used herein means the linear displacement of the surface of a substrate with respect to a z-axis, which is perpendicular to the top and bottom sides, or major surfaces of the substrate. The term "distortion" as used herein means the displacement of a substrate in-plane (i.e., the x-y plane, which is parallel to the top and bottom sides, or major surfaces of the substrate). For example, distortion could include shrinkage in the x-y plane of a substrate and/or expansion in the x-y plane of the substrate.

The term "CTE matched material" and the like as used herein means a material that has a coefficient of thermal expansion (CTE) which differs from the CTE of a reference material by less than about 20 percent (%). Preferably, the CTEs differ by less than about 10%, 5%, 3%, or 1%.

The term "flexible substrate" as used herein means a free-standing substrate that readily adapts its shape. Accordingly, in many embodiments, the flexible substrate can comprise (e.g., consist of) a flexible material, and/or can comprise a thickness (e.g., an average thickness) that is sufficiently thin so that the substrate readily adapts in shape. In these or other embodiments, a flexible material can refer to a material having a low elastic modulus. Further, a low elastic modulus can refer to an elastic modulus of less than approximately five GigaPascals (GPa). In some embodiments, a substrate that is a flexible substrate because it is sufficiently thin so that it readily adapts in shape, may not be a flexible substrate if implemented with a greater thickness, and/or the substrate may have an elastic modulus exceeding five GPa. For example, the elastic modulus could be greater than or equal to approximately five GPa but less than or equal to approximately twenty GPa, fifty GPa, seventy GPa, or eighty GPa. Exemplary materials for a substrate that is a flexible substrate because it is sufficiently thin so that it readily adapts in shape, but that may not be a flexible substrate if implemented with a greater thickness, can comprise certain glasses (e.g., fluorosilicate glass, borosilicate glass, Corning® glass, Willow™ glass, and/or Vitrelle glass, etc., such as, for example, as manufactured by Corning Inc. of Corning, New York, United States of America, etc.) or silicon having a thickness greater than or equal to approximately 25 micrometers and less than or equal to approximately 100 micrometers.

Meanwhile, the term "rigid substrate" as used herein can mean a free-standing substrate that does not readily adapt its shape and/or a substrate that is not a flexible substrate. In some embodiments, the rigid substrate can be devoid of flexible material and/or can comprise a material having an elastic modulus greater than the elastic modulus of a flexible substrate. In various embodiments, the rigid substrate can be implemented with a thickness that is sufficiently thick so that the substrate does not readily adapt its shape. In these or other examples, the increase in rigidity of the carrier substrate provided by increasing the thickness of the carrier substrate can be balanced against the increase in cost and weight provided by increasing the thickness of the carrier substrate.

As used herein, "polish" can mean to lap and polish a surface or to only lap the surface.

DETAILED DESCRIPTION OF EXAMPLES OF EMBODIMENTS

Some embodiments include a method. The method can comprise: providing a carrier substrate; providing a release layer over the carrier substrate, the release layer comprising polymethylmethacrylate; and providing a device substrate over the carrier substrate and the release layer. In these embodiments, providing the device substrate can comprise: bonding the device substrate to the carrier substrate, the device substrate bonding to the carrier substrate with a first adhesion strength; and bonding the device substrate to the release layer, the device substrate bonding to the release layer with a second adhesion strength less than the first adhesion strength. Further, providing the release layer can comprise bonding the release layer to the carrier substrate, the release layer bonding to the carrier substrate with a third adhesion strength greater than the second adhesion strength.

Other embodiments include a method. The method can comprise: providing a carrier substrate; providing a release layer over the carrier substrate, the release layer comprising polymethylmethacrylate; and providing a device substrate over the carrier substrate and the release layer. In these embodiments, providing the device substrate can comprise: bonding (e.g., directly) the device substrate to the carrier substrate, the device substrate bonding to the carrier substrate with a first adhesion strength; and bonding the device substrate to the release layer, the device substrate bonding to the release layer with a second adhesion strength less than the first adhesion strength. Further, providing the release layer can comprise bonding (e.g., directly) the release layer to the carrier substrate, the release layer bonding to the carrier substrate with a third adhesion strength greater than the second adhesion strength. The carrier substrate can comprise a rigid substrate, the device substrate can comprise a flexible substrate, and the flexible substrate can comprise polyimide and/or polyamide. Meanwhile, the second adhesion strength can comprise a tensile adhesion strength less than or equal to approximately 0.25 MegaPascals.

Further embodiments include a system. The system comprises a carrier substrate comprising a rigid substrate, a release layer over the carrier substrate, and a device substrate over the carrier substrate and the release layer. The release layer can comprise polymethylmethacrylate, the device substrate can comprise a flexible substrate, and the flexible substrate can comprise polyimide and/or polyamide. Meanwhile, the device substrate can be bonded (a) to the carrier substrate with a first adhesion strength and (b) to the release layer with a second adhesion strength less than the first adhesion strength. Further, the release layer can be bonded to the carrier substrate with a third adhesion strength greater than the second adhesion strength.

Turning to the drawings, FIG. 1 illustrates a flow chart for an embodiment of method 100 of providing a semiconductor device. Method 100 is merely exemplary and is not limited to the embodiments presented herein. Method 100 can be employed in many different embodiments or examples not specifically depicted or described herein. In some embodiments, the activities, procedures, and/or processes of method 100 can be performed in the order presented. In other embodiments, the activities, procedures, and/or processes of method 100 can be performed in any other suitable order. In still other embodiments, one or more of the activities, procedures, and/or processes in method 100 can be combined or skipped. Although the semiconductor device can comprise any suitable electronic device, in many embodiments, the semiconductor device can comprise an electronic display, an x-ray sensor, a biological sensor, etc.

Figure 2:
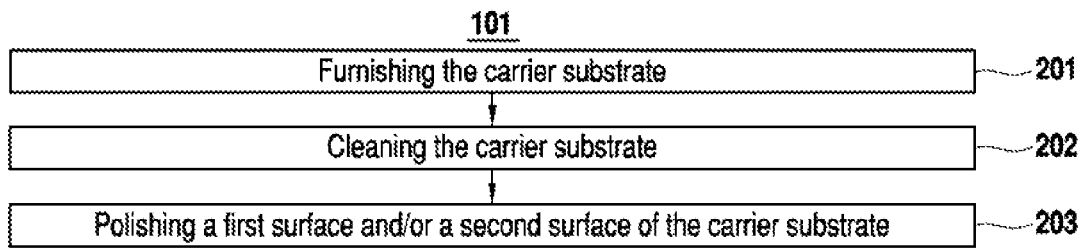
FIG. 2 illustrates an exemplary activity of providing a carrier substrate, according to the embodiment of FIG. 1.

Method 100 can comprise activity 101 of providing a carrier substrate. FIG. 2 illustrates an exemplary activity 101, according to the embodiment of FIG. 1.

For example, activity 101 can comprise activity 201 of furnishing the carrier substrate. The carrier substrate can comprise a first surface and a second surface opposite the first surface.

In many embodiments, the carrier substrate can comprise a rigid substrate. The carrier substrate (e.g., rigid substrate) can comprise any suitable material(s) having the characteristics of a rigid substrate as defined above. Specifically, exemplary material(s) can comprise alumina ($Al_2O_3$), silicon, glass (e.g., barium borosilicate, soda lime silicate, and/or an alkali silicate), metal (e.g., steel), and/or sapphire. However, in some embodiments, the carrier substrate (e.g., rigid substrate) can be devoid of silicon. Meanwhile, in many embodiments, the glass can comprise a low CTE glass.

Further, material(s) for the carrier substrate (e.g., rigid substrate) also can be selected so that a CTE of the material(s) approximately matches a CTE of the material(s) of the device substrate and/or the release layer, each of which is introduced briefly above and described in greater detail below. Likewise, in some embodiments, material(s) for the device substrate and/or release layer can be selected so as to be CTE matched with the material(s) of the carrier substrate. Non-matched CTEs can create stress between the carrier substrate, the device substrate and/or the release layer.

Meanwhile, in many embodiments, the carrier substrate can be a wafer or panel. The wafer or panel can comprise any suitable largest dimension (e.g., diameter), such as, for example, approximately 6 inches (approximately 15.24 centimeters), approximately 8 inches (approximately 20.32 centimeters), approximately 12 inches (approximately 30.48 centimeters), or approximately 18 inches (approximately 45.72 centimeters). In some embodiments, the carrier substrate can be a panel of approximately 370 mm by approximately 470 mm. In some examples, the wafer or panel can comprise a thickness of at least approximately 0.5 millimeters.

Later, in some embodiments, activity 101 can comprise activity 202 of cleaning the carrier substrate. In some embodiments, activity 202 can comprise an activity of cleaning the carrier substrate with plasma (e.g., $O_2$ plasma).

Then, activity 101 can comprise activity 203 of polishing the first surface and/or the second surface of the carrier substrate. Polishing the surface of the carrier substrate (e.g., the first surface) that is not subsequently bonded with the device substrate and release layer, as described below, improves the ability of a vacuum or air chuck to handle the carrier substrate. Also, polishing the surface of the carrier substrate (e.g., the second surface) that is subsequently coupled to the device substrate and release layer, as described below, removes topological features at the surface of the carrier substrate that could cause roughness of the resulting device substrate assembly in the z-axis after the device substrate and carrier substrate are bonded together.

Figure 3:
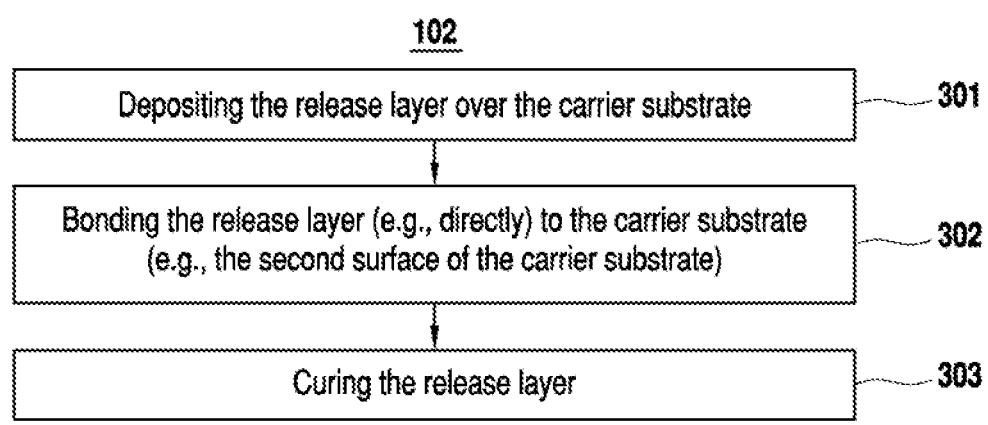
FIG. 3 illustrates an exemplary activity of providing a release layer over the carrier substrate, according to the embodiment of FIG. 1.

Next, returning to FIG. 1, method 100 can comprise activity 102 of providing a release layer over the carrier substrate, such as, for example, over the second surface of the carrier substrate. As explained below, in various embodiments, the release layer can comprise any suitable material(s) able to bond to the carrier substrate with a release layer-carrier substrate adhesion strength greater than a device substrate-release layer adhesion strength, as described below. Further, in these or other embodiments, the material(s) of the release layer can be configured to bond to the carrier substrate with a release layer-carrier substrate adhesion strength greater than a device substrate-release layer adhesion strength by direct bonding of the release layer to the carrier substrate (e.g., without implementing an adhesion layer configured to bond the release layer to the carrier substrate). Further still, in these or other embodiments, the material(s) of the release layer can be configured to sufficiently bond with the device substrate to constrain the substrate during activity 107 so as to prevent runout printing errors from resulting. For example, in many embodiments, the release layer can comprise a transparent thermoplastic material (e.g., polymethylmethacrylate (PMMA)). FIG. 3 illustrates an exemplary activity 102, according to the embodiment of FIG. 1.

Activity 102 can comprise activity 301 of depositing the release layer over the carrier substrate (e.g., the second surface of the carrier substrate). In many embodiments, activity 301 can comprise an activity of depositing the release layer over the carrier substrate (e.g., the second surface of the carrier substrate) via spin-coating, spray-coating, extrusion coating, preform lamination, slot die coating, screen lamination, and/or screen printing.

For example, in many embodiments, the release layer can be deposited over the carrier substrate (e.g., the second surface of the carrier substrate) under one or more predetermined conditions. The predetermined conditions can be dependent on a desired release layer thickness, as discussed below. In specific examples, the release layer can be deposited while spinning the carrier substrate first at a spin rate of approximately 500 revolutions per minute for a time of approximately 5 seconds. Then, the carrier substrate can be held stationary for a time of approximately 10 seconds before spinning the carrier substrate for a time of approximately 45 seconds at a spin rate greater than or equal to approximately 500 revolutions per minute and less than or equal to approximately 3000 revolutions per minute, such as, for example, to distribute the release layer over the carrier substrate. For example, the carrier substrate can be spun at a spin rate of approximately 1000 revolutions per minute.

Figure 7:
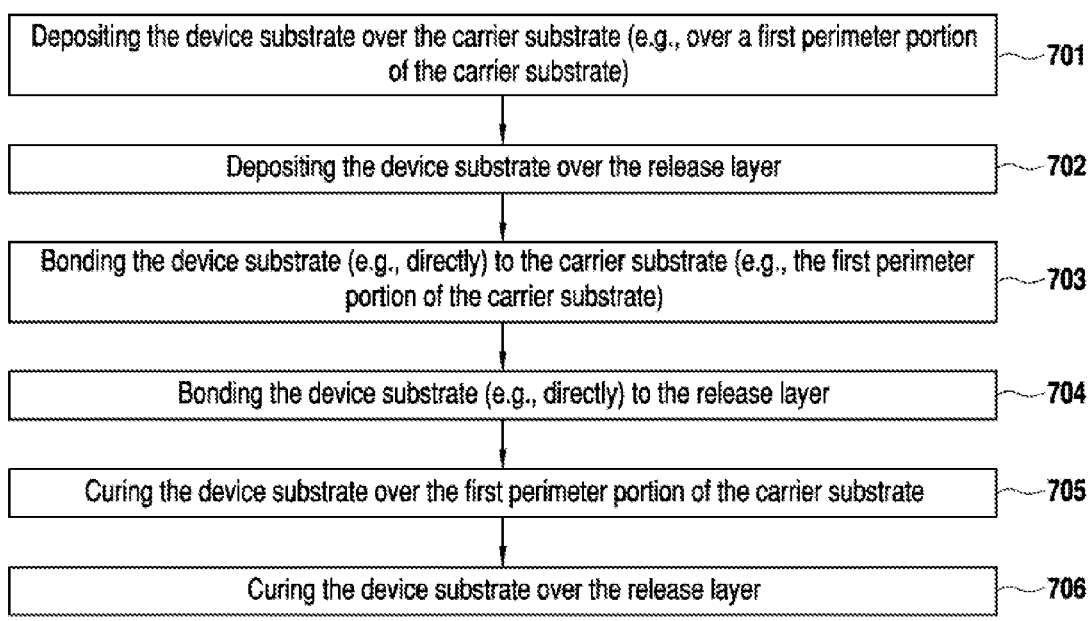
FIG. 7 illustrates an exemplary activity of providing a device substrate over the carrier substrate and the release layer, according to the embodiment of FIG. 1.

The release layer can be provided (e.g., deposited) to comprise a release layer thickness (i.e., a dimension of the release layer that is approximately perpendicular to the second surface of the carrier substrate when the release layer is bonded to the carrier substrate). In many embodiments, the release layer thickness can be approximately constant. In some embodiments, the release layer thickness can be greater than or equal to approximately 0.1 micrometers and less than or equal to approximately 25 micrometers. Generally, the release layer thickness can be selected to be thick enough to ensure continuous distribution of the release layer over the carrier substrate. Further, the release layer thickness can be selected to be as thin as possible, while still permitting the foregoing, to minimize bowing, warping, and/or distortion of the device substrate when the device substrate is bonded to the carrier substrate and the release layer, as described below at activities 703 and 704 (FIG. 7).

Also, activity 102 can comprise activity 302 of bonding the release layer (e.g., directly) to the carrier substrate (e.g., the second surface of the carrier substrate). The release layer can be bonded to the carrier substrate (e.g., the second surface of the carrier substrate) with a release layer-carrier substrate adhesion strength. In many embodiments, activity 302 can be part of activity 301.

In many embodiments, activity 102 (e.g., activities 301 and 302) can be performed without using tape (e.g., for bonding and/or masking purposes). By performing activity 102 (e.g., activities 301 and 302) without the use of tape, activities of applying and removing the tape can be omitted from method 100 (FIG. 1) generally. As a result, performing method 100 (FIG. 1) can be simplified with fewer total activities performed. Meanwhile, performing activity 102 (e.g., activities 301 and 302) without the use of tape can make it possible to provide surfaces and/or edges of the release layer that are more uniform (e.g., approximately planar) for improved semiconductor device processing (e.g., handling, process chamber clamping, outgassing, trapping liquids, etc.) and/or that are free of residue that can be left by the tape adhesives. For example, even to the extent tape would not overlap when applied, the single layer of the tape would still make the release layer uneven. Moreover, avoiding the use of tape at activity 102 (e.g., activities 301 and 302) can be advantageous because, in addition to residue left by the tape, the tape may damage the release layer when being removed, providing additional potential for debris formation that can result in semiconductor device defects.

Then, in many embodiments, activity 102 can comprise activity 303 of curing the release layer. In many embodiments, activity 303 can help to remove from the release layer chemistry (e.g., solvents) used to perform activity 301 (above). In these or other embodiments, activity 303 can help to bond the release layer to the carrier substrate (e.g., the second surface of the carrier substrate). The release layer can be thermally cured and/or optically cured, as desirable. For example, in many embodiments, the release layer can be thermally cured in open air conditions, at a temperature of greater than or equal to approximately 150° C. and less than or equal to approximately 200° C., and/or for a time of approximately 90 seconds. In more specific examples, the temperature can comprise approximately 180° C.

Figure 4:
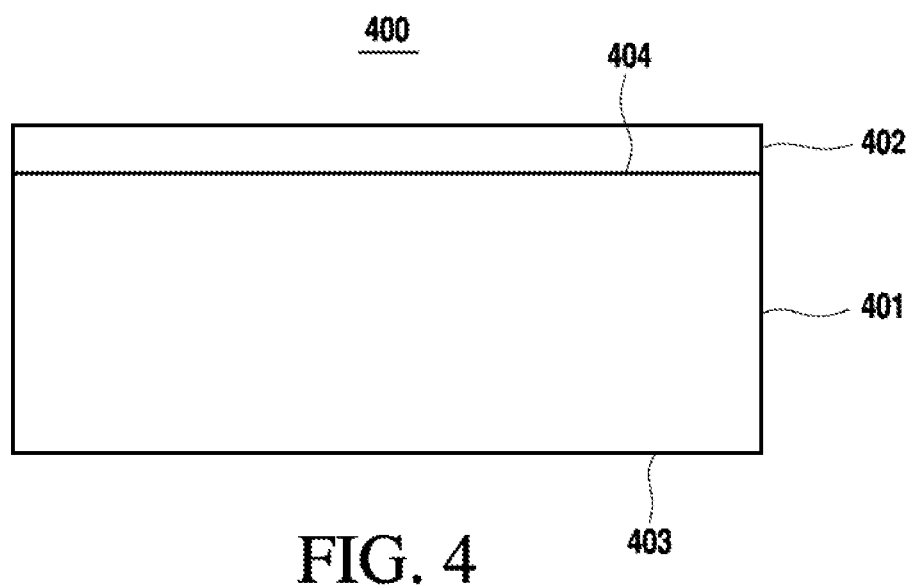
FIG. 4 illustrates a partial cross-sectional view of a semiconductor device after providing a release layer over a carrier substrate, according to an embodiment.

Turning ahead in the drawings, FIG. 4 illustrates a partial cross-sectional view of semiconductor device 400 after providing release layer 402 over carrier substrate 401, according to an embodiment. Semiconductor device 400 can be similar or identical to the semiconductor device of method 100 (FIG. 1). Further, carrier substrate 401 and/or release layer 402 can be similar or identical to the carrier substrate and/or release substrate of method 100 (FIG. 1), respectively. Accordingly, carrier substrate 401 can comprise first surface 403 and second surface 404 opposite of first surface 403.

Referring now back to FIG. 1, method 100 can comprise activity 103 of removing a release layer edge portion of the release layer from over the carrier substrate. More specifically, activity 103 can be performed to expose a first perimeter portion of the second surface of the carrier substrate to permit the device substrate to be bonded to the carrier substrate (i.e., at the first perimeter portion of the second surface of the carrier substrate), as described at activity 703 (FIG. 7). The first perimeter portion of the carrier substrate can refer to a portion of the second surface of the carrier substrate located between an edge of the carrier substrate and a first perimeter of the carrier substrate. The first perimeter can refer to a continuous reference line located at the second surface of the carrier substrate a first predetermined distance from the edge of the carrier substrate. The first predetermined distance can be selected so as to be large enough to ensure the device substrate bonded to the carrier substrate and release layer, as described at activities 703 and 704 (FIG. 7), completely covers the release layer. Further, the first predetermined distance can be selected to be as small as possible, while still permitting the foregoing, to maximize a surface area of the device substrate on which one or more semiconductor elements can be provided, as described below with respect to activity 107 (FIG. 1). For example, the first predetermined distance can be greater than or equal to approximately 1 millimeter. FIG. 5 illustrates an exemplary activity 103, according to the embodiment of FIG. 1.

Activity 103 can comprise activity 501 of performing an edge bead removal with a solvent to remove the release layer edge portion of the release layer from over the carrier substrate. The solvent can comprise propylene glycol methyl ether acetate (PMEA).

Next, activity 103 can comprise activity 502 of performing an edge bead removal by reactive ion etching the release layer to remove the release layer edge portion of the release layer from over the carrier substrate. In some embodiments, when activity 501 is performed, activity 502 can be omitted, and vice versa. Further, activity 501 can be performed prior to activity 502, or vice versa.

Referring briefly back to FIG. 1, in some embodiments, activity 103 can be omitted. For example, activity 103 may be unnecessary if activity 301 (FIG. 3) is performed in a manner leaving the first perimeter portion of the carrier substrate exposed.

Figure 6:
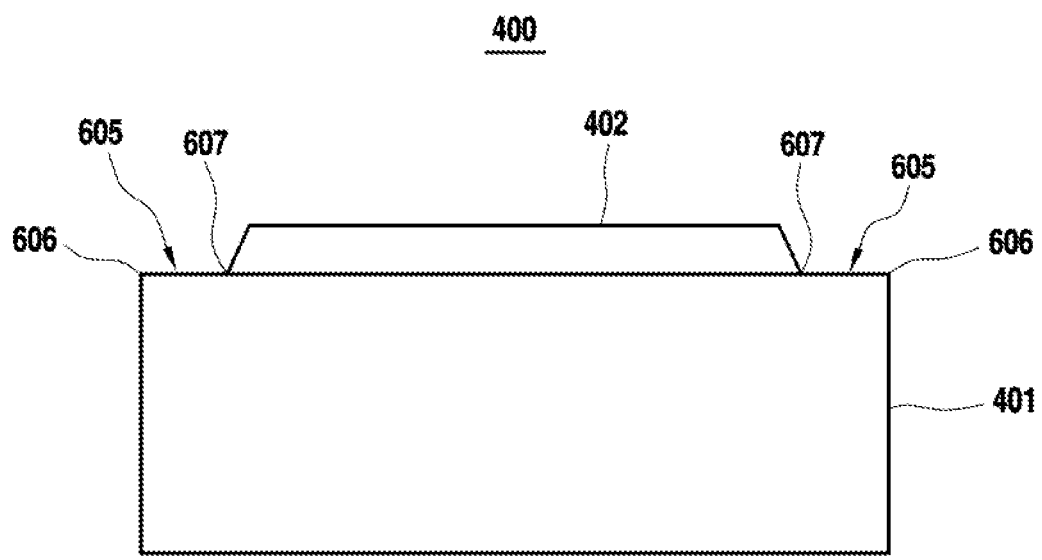
FIG. 6 illustrates a partial cross-sectional view of the semiconductor device after removing a release layer edge portion of the release layer from a first perimeter portion of the carrier substrate, according to the embodiment of FIG. 4.

Turning ahead in the drawings, FIG. 6 illustrates a partial cross-sectional view of semiconductor device 400 after removing a release layer edge portion of release layer 402 from first perimeter portion 605 of carrier substrate 401, according to the embodiment of FIG. 4. First perimeter portion 605 can be similar or identical to the first perimeter portion of the carrier substrate described above with respect to method 100 (FIG. 1). Accordingly, first perimeter portion 605 can be located between edge 606 of carrier substrate 401 and first perimeter 607 of carrier substrate 401.

Referring again back to FIG. 1, method 100 can comprise activity 104 of providing a device substrate over the carrier substrate and the release layer. In many embodiments, the device substrate can comprise a flexible substrate. The device substrate (e.g., flexible substrate) can comprise any suitable material(s) having the characteristics of a flexible substrate as defined above. Specifically, exemplary material(s) can comprise polyimide and/or polyamide. Meanwhile, although any suitable polyimide and/or polyamide material(s) can be implemented for the device substrate, exemplary material(s) of the device substrate can comprise one or more HD-8820 series and/or HD-4000 polyimides, which are manufactured by the E.I. du Pont de Nemours and Company of Wilmington, Del., United States of America, and/or can comprise one or more polyamides similar to the HD-8820 series and/or the HD-4000 polyimides. Implementing the device substrate to comprise polyimide and/or polyamide can be advantageous because polyimide and polyamide can be made very thin, can be rugged, and can be substantially inert to semiconductor manufacturing chemistries and/or biological chemistries. FIG. 7 illustrates an exemplary activity 104, according to the embodiment of FIG. 1.

Activity 104 can comprise activity 701 of depositing the device substrate over the carrier substrate (e.g., over the first perimeter portion of the carrier substrate). In many embodiments, activity 701 can comprise an activity of depositing the device substrate over the carrier substrate (e.g., over the first perimeter portion of the carrier substrate) via spin-coating, spray-coating, extrusion coating, preform lamination, slot die coating, screen lamination, and/or screen printing.

For example, in many embodiments, the device substrate can be deposited over the carrier substrate (e.g., over the first perimeter portion of the carrier substrate) under one or more predetermined conditions. Similar to the release layer, the predetermined conditions can be dependent on a desired device substrate thickness, as discussed below. In specific examples, the device substrate can be deposited while spinning the carrier substrate at a spin rate greater than or equal to approximately 500 revolutions per minute and less than or equal to approximately 6000 revolutions per minute for a time of greater than or equal to approximately 10 seconds and less than or equal to approximately 100 seconds. For example, the spin rate can be approximately 1000 revolutions per minute and the time can be approximately 25 seconds.

Further, activity 104 can comprise activity 702 of depositing the device substrate over the release layer. In some embodiments, activity 702 can be performed in a manner similar or identical to that of activity 701, but with respect to the release layer rather than the carrier substrate.

Notably, in many embodiments, activity 702 (and one or more of the sub-activities of activity 702) can be part of activity 701 (and one or more of the sub-activities of activity 701), and vice versa. In these or other embodiments, activity 701 and activity 702 can occur approximately simultaneously.

Whether the device substrate is provided (e.g., deposited) as separate or conjoined activities 701 and 702, the device substrate can be provided (e.g., deposited) to comprise a device substrate thickness (i.e., a dimension of the device substrate over the release layer that is approximately perpendicular to the release layer when the device substrate is bonded to the carrier substrate). Notably, for reference purposes, calculation of the device substrate thickness excludes the portion of the device substrate over the first perimeter portion of the carrier substrate, which it follows would be larger than the device substrate thickness by an amount approximately equal to the release layer thickness. In many embodiments, the device substrate thickness can be approximately constant. Likewise, a thickness of the portion of the device substrate over the first perimeter portion of the carrier substrate can also be approximately constant. In some embodiments, the device substrate thickness can be greater than or equal to approximately 1 micrometer and less than or equal to approximately 1 millimeter. For example, the device substrate thickness can be approximately 20 micrometers. Generally, the device substrate thickness can be selected to be thick enough to ensure continuous distribution of the device substrate over the carrier substrate and the release layer. Further, the device substrate thickness can be selected to be as thin as possible, while still permitting the foregoing, to minimize bowing, warping, and/or distortion of the device substrate when the device substrate is bonded to the carrier substrate and the release layer, as described below at activities 703 and 704.

Also, activity 104 can comprise activity 703 of bonding the device substrate (e.g., directly) to the carrier substrate (e.g., the first perimeter portion of the carrier substrate). The device substrate can be bonded to the carrier substrate with a device substrate-carrier substrate adhesion strength. In many embodiments, activity 703 can be part of activity 701.

Activity 104 also can comprise activity 704 of bonding the device substrate (e.g., directly) to the release layer. The device substrate can be bonded to the release layer with a device substrate-release layer adhesion strength. In many embodiments, activity 704 can be part of activity 702. Meanwhile, in many embodiments, activity 703 can be part of activity 704, and vice versa. In these or other embodiments, activity 703 and activity 704 can occur approximately simultaneously.

In many embodiments, activity 703 and/or activity 704 can comprise an activity of sealing the release layer between the device substrate and the carrier substrate. Accordingly, sealing the release layer between the device substrate and the carrier substrate can prevent debonding (e.g., unintentional debonding) of the release layer from the device substrate and/or the carrier substrate when performing activity 107 (FIG. 1).

In many embodiments, activity 104 (e.g., activities 701-704) can be performed without using tape (e.g., for bonding and/or masking purposes). By performing activity 104 (e.g., activities 701-704) without the use of tape, activities of applying and removing the tape can be omitted from method 100 (FIG. 1) generally. As a result, performing method 100 (FIG. 1) can be simplified with fewer total activities performed. Meanwhile, performing activity 104 (e.g., activities 701-704) without the use of tape can make it possible to provide surfaces and/or edges of the resulting device substrate assembly and/or the constituent elements of the resulting device substrate assembly (e.g., the carrier substrate, the release layer, the device substrate, etc.) that are more uniform (e.g., approximately planar) for improved semiconductor device processing (e.g., handling, process chamber clamping, outgassing, trapping liquids, etc.) and/or that are free of residue that can be left by the tape adhesives. For example, even to the extent tape would not overlap when applied, the single layer of the tape would still make the device area of the device substrate uneven. Moreover, avoiding the use of tape at activity 104 (e.g., activities 701-704) can be advantageous because placement and alignment of tape to avoid interference with a device area of the device substrate can be challenging, and in addition to residue left by the tape, the tape may even damage the device substrate and/or release layer when being removed, providing additional potential for debris formation that can result in semiconductor device defects.

In many embodiments, activity 104 can further comprise activity 705 of curing the device substrate over the first perimeter portion of the carrier substrate. In many embodiments, activity 705 can help to remove from the device substrate chemistry (e.g., solvents) used to perform activity 701 (above). In these or other embodiments, activity 705 can help to bond the device substrate to the carrier substrate (e.g., the first perimeter portion of the carrier substrate). The device substrate can be thermally cured and/or optically cured, as desirable. Further in some embodiments, activity 705 can be performed as a multi-part cure. In one example, in many embodiments, first, the device substrate can be thermally cured first in open air conditions, at a temperature of greater than or equal to approximately 50° C. and less than or equal to approximately 100° C., and/or for a time of approximately 15 minutes. For example, the temperature can comprise approximately 90° C. In a second example, the device substrate can be thermally cured first in open air conditions, at a temperature of greater than or equal to approximately 120° C. and less than or equal to approximately 180° C., and/or for a time of approximately 15 minutes. For example, the temperature can comprise approximately 150° C.

Next, in many embodiments, activity 104 can comprise activity 706 of curing the device substrate over the release layer. In many embodiments, activity 706 can help to remove from the device substrate chemistry (e.g., solvents) used to perform activity 702 (above). In these or other embodiments, activity 706 can help to bond the device substrate to the release layer. The device substrate can be thermally cured and/or optically cured, as desirable. Further in some embodiments, activity 706 can be performed in a manner similar or identical to that of activity 705.

Notably, in many embodiments, activity 706 (and one or more of the sub-activities of activity 706) can be part of activity 705 (and one or more of the sub-activities of activity 705), and vice versa. In these or other embodiments, activity 705 and activity 706 can occur approximately simultaneously with each other.

Figure 8:
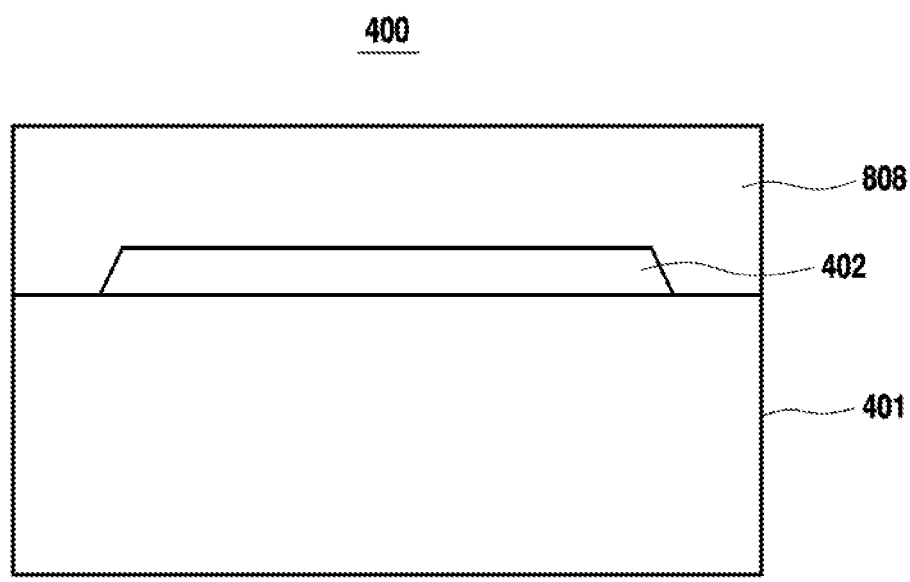
FIG. 8 illustrates a partial cross-sectional view of the semiconductor device after providing a device substrate over the carrier substrate and release layer, according to the embodiment of FIG. 4.

Turning ahead in the drawings, FIG. 8 illustrates a partial cross-sectional view of semiconductor device 400 after providing device substrate 808 over carrier substrate 401 and release layer 402, according to the embodiment of FIG. 4. Device substrate 808 can be similar or identical to the device substrate described above with respect to method 100 (FIG. 1).

Referring now back to FIG. 1, method 100 can comprise activity 105 of removing a device substrate edge portion of the device substrate from over the carrier substrate. More specifically, activity 105 can be performed to expose a second perimeter portion of the second surface of the carrier substrate, such as, for example, to offset the device substrate from the edge of the carrier substrate. Offsetting the device substrate from the edge of the carrier substrate can prevent processing malfunctions (e.g., hangups) on automated wafer handlers, flat finders, and other equipment as can result when the device substrate and the carrier substrate are equally sized.

The second perimeter portion of the carrier substrate can refer to a portion of the second surface of the carrier substrate located between the edge of the carrier substrate and a second perimeter of the carrier substrate. The second perimeter can refer to a continuous reference line located at the second surface of the carrier substrate a second predetermined distance from the edge of the carrier substrate. Thus, the first perimeter portion of the carrier substrate can comprise the second perimeter portion of the carrier substrate, and the second perimeter can be located between the edge and the first perimeter of the carrier substrate.

Figure 9:
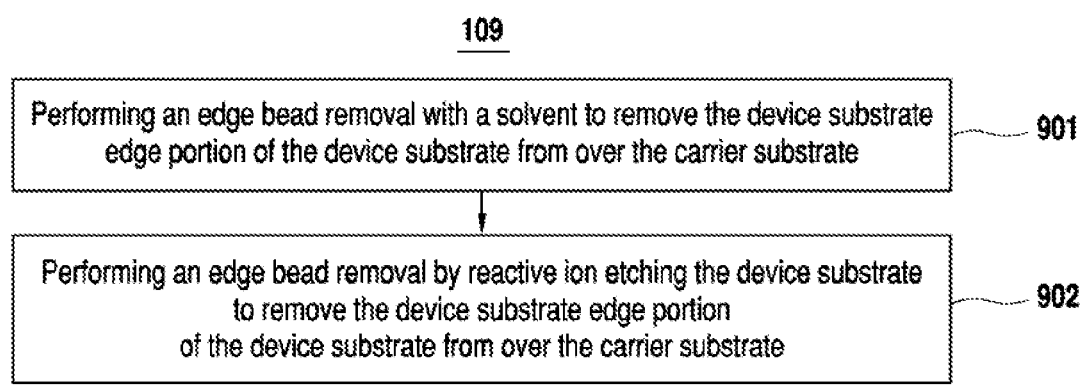
FIG. 9 illustrates an exemplary activity of removing a device substrate edge portion of the device substrate from over the carrier substrate, according to the embodiment of FIG. 1.

Like for the first predetermined distance of the first perimeter of the carrier substrate, the second predetermined distance can be selected so as to be large enough to ensure the device substrate provided over the release layer, as described at activities 704 (FIG. 7), completely covers the release layer. Further, the second predetermined distance can be selected to be as small as possible, while still permitting the foregoing, to maximize the surface area of the device substrate on which one or more semiconductor elements can be provided, as described below with respect to activity 107 (FIG. 1). For example, the second predetermined distance can be greater than or equal to approximately 0.5 millimeters. In these or other embodiments, the second predetermined distance can be less than the first predetermined distance to ensure the device substrate provided over the release layer, as described at activities 704 (FIG. 7), completely covers the release layer. FIG. 9 illustrates an exemplary activity 105, according to the embodiment of FIG. 1.

Activity 105 can comprise activity 901 of performing an edge bead removal with a solvent to remove the device substrate edge portion of the device substrate from over the carrier substrate. The solvent can comprise N-methyl-2-pyrrolidone (NMP).

Activity 105 also can comprise activity 902 of performing an edge bead removal by reactive ion etching the device substrate to remove the device substrate edge portion of the device substrate from over the carrier substrate. In some embodiments, when activity 901 is performed, activity 902 can be omitted, and vice versa. Further, activity 901 can be performed prior to activity 902, or vice versa.

In some embodiments, activity 105 can be omitted. For example, activity 105 may be unnecessary if activity 701 (FIG. 7) is performed in a manner leaving the second perimeter portion of the carrier substrate exposed.

Figure 10:
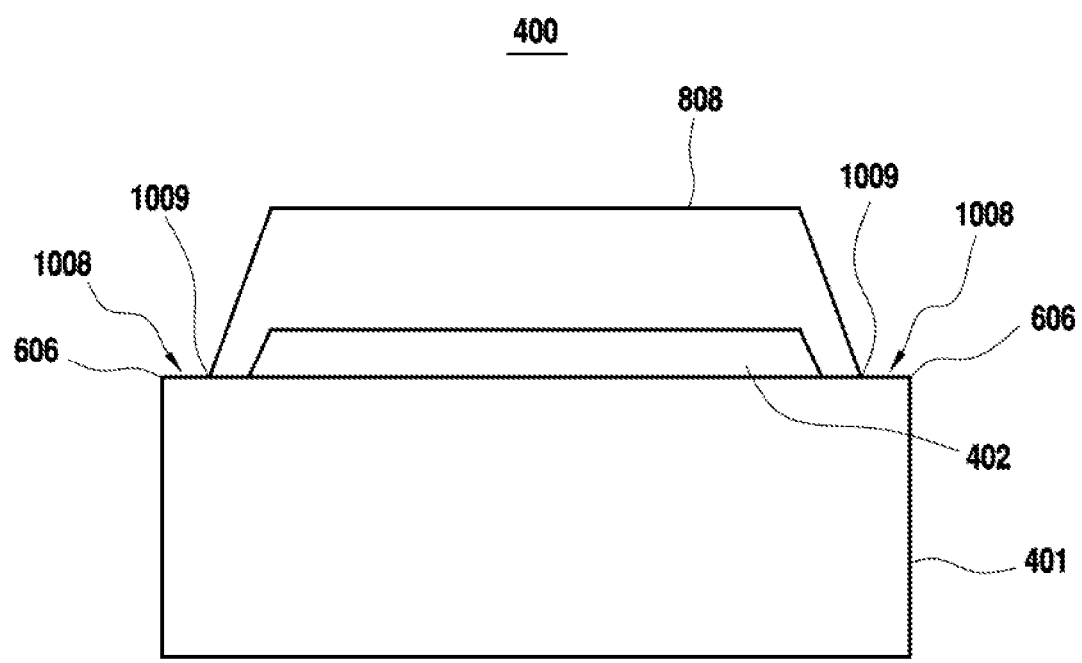
FIG. 10 illustrates a partial cross-sectional view of the semiconductor device after removing a device substrate edge portion of the device substrate from a second perimeter portion of the carrier substrate, according to the embodiment of FIG. 4.

Turning ahead in the drawings, FIG. 10 illustrates a partial cross-sectional view of semiconductor device 400 after removing a device substrate edge portion of device substrate 808 from second perimeter portion 1008 of carrier substrate 401, according to the embodiment of FIG. 4. Second perimeter portion 1008 can be similar or identical to the second perimeter portion of the carrier substrate described above with respect to method 100 (FIG. 1). Accordingly, second perimeter portion 1008 can be located between edge 606 of carrier substrate 401 and second perimeter 1009 of carrier substrate 401. Also, second perimeter portion 1008 can be smaller than and/or a portion of first perimeter portion 605 (FIG. 6).

Referring again back to FIG. 1, method 100 can comprise activity 106 of curing the device substrate and the release layer while the device substrate is coupled to the carrier substrate and the release layer and while the release layer is coupled to the carrier substrate. The device substrate and the release layer can be thermally cured and/or optically cured, as desirable. For example, in many embodiments, first, the device substrate can be thermally cured first in vacuum conditions, at a temperature of greater than or equal to approximately 180° C. and less than or equal to approximately 235° C., and/or for a time of greater than or equal to approximately 1 hour and less than or equal to approximately 8 hours. For example, the temperature can comprise approximately 180° C. or 220° C. In many embodiments, such as, for example, when the release layer comprises PMMA, performing activity 106 above a temperature causing the release layer to transition into a non-solid material (e.g., approximately 235° C.) can cause the device substrate-release layer adhesion strength to increase substantially such that a difficulty of performing activity 109 (FIG. 1), as described below, can be increased.

Figure 11:
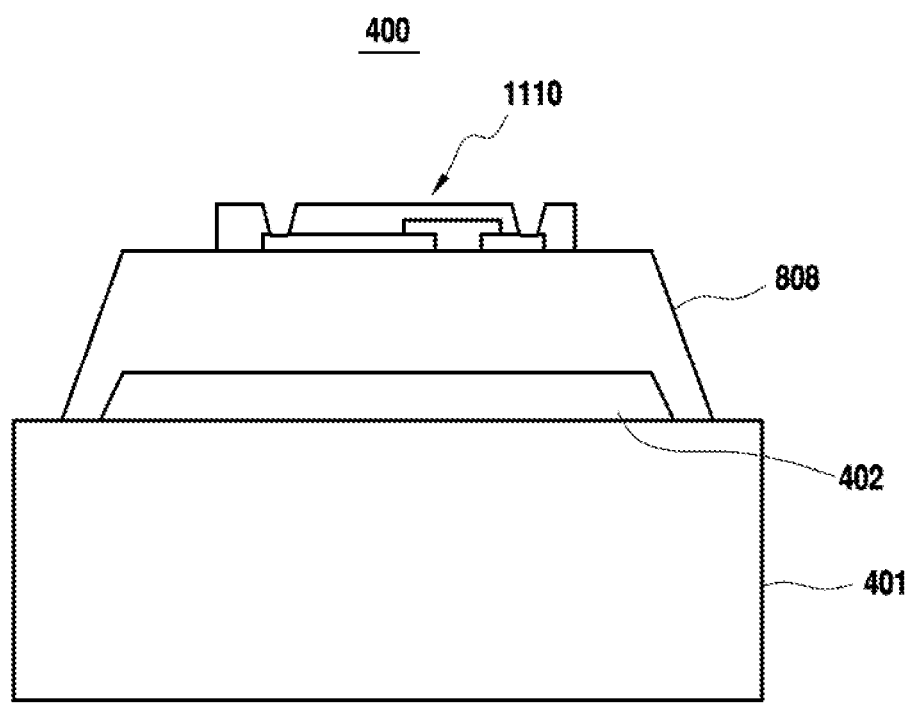
FIG. 11 illustrates a partial cross-sectional view of the semiconductor device after providing one or more semiconductor elements over the device substrate, according to the embodiment of FIG. 4.

Next, method 100 can comprise activity 107 of providing one or more semiconductor elements (e.g., transistors, detectors, emitters, etc.) over the device substrate while the device substrate is bonded to the carrier substrate and the release layer. In some embodiments, the semiconductor element(s) can be provided over the device substrate in accordance with any conventional semiconductor manufacturing process that does not exceed a temperature of 200° C. In further embodiments, the semiconductor element(s) can be provided over the device substrate in accordance with any conventional semiconductor manufacturing process that does not exceed a temperature of 235° C. For example, in various embodiments, the semiconductor element(s) can be provided over the device substrate in accordance with the semiconductor manufacturing processes described in U.S. Pat. Ser. No. 8,999,778, International Patent Application Publication Serial No. WO 2012138903, and/or International Patent Application Publication Serial No. WO 2013082138, each of which is incorporated herein by reference in its entirety. In some embodiments, activity 107 can be performed after activity 105. Further, activity 107 can be performed before activity 108 and/or activity 109. FIG. 11 illustrates a partial cross-sectional view of semiconductor device 400 after providing one or more semiconductor elements 1110 over device substrate 808, according to the embodiment of FIG. 4.

Figure 12:
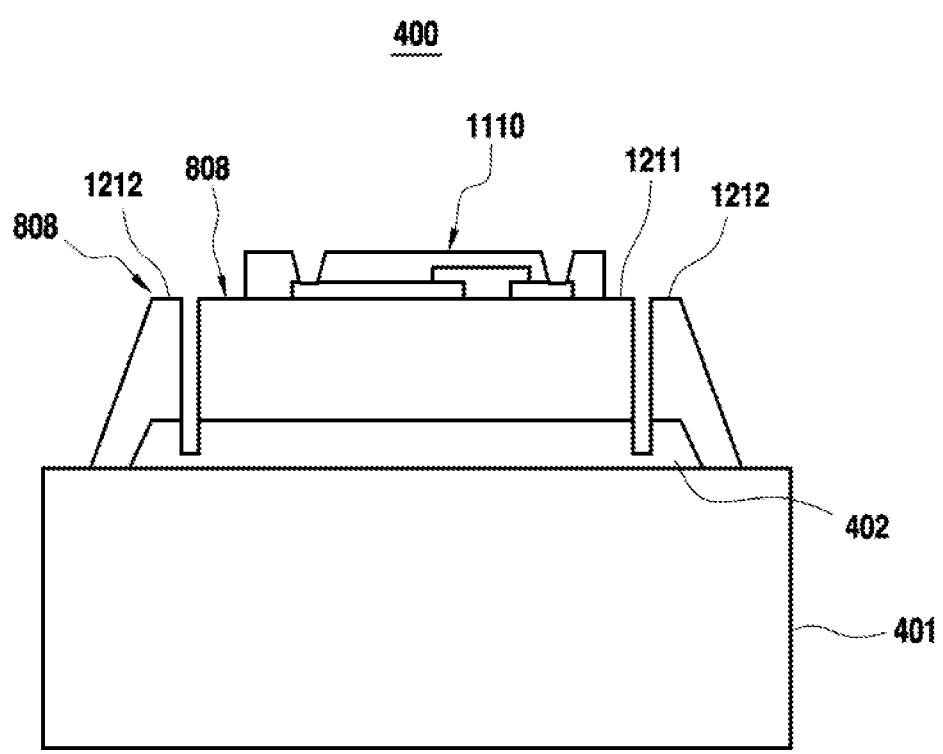
FIG. 12 illustrates a partial cross-sectional view of the semiconductor device after severing a device portion of the device substrate from a non-device portion of the device substrate, according to the embodiment of FIG. 4.

Referring again to FIG. 1, method 100 can comprise activity 108 of severing a device portion of the device substrate from a non-device portion of the device substrate (e.g., at a location inside the first perimeter of the carrier substrate). The non-device portion of the device substrate can be bonded to the carrier substrate. Meanwhile, the device portion of the device substrate can be bonded only to the release layer. The device portion comprises at least part of the semiconductor element(s). In some embodiments, the non-device portion can comprise part of the semiconductor element(s). The device portion of the device substrate can be severed from the non-device portion of the device substrate using any suitable cutting implement (e.g., a blade, a laser, etc.). In many embodiments, activity 108 in FIG. 1 can be performed such that when activity 109 (below) is performed, some or all of the semiconductor element(s) remain with the device portion of the device substrate (e.g., leaving as little of the semiconductor element(s) behind with the non-device portion of the device substrate as possible). In many embodiments, activity 108 in FIG. 1 can occur after activity 107. Further, activity 108 can occur before activity 109. FIG. 12 illustrates a partial cross-sectional view of semiconductor device 400 after severing device portion 1211 of device substrate 808 from non-device portion 1212 of device substrate 808, according to the embodiment of FIG. 4.

Figure 13:
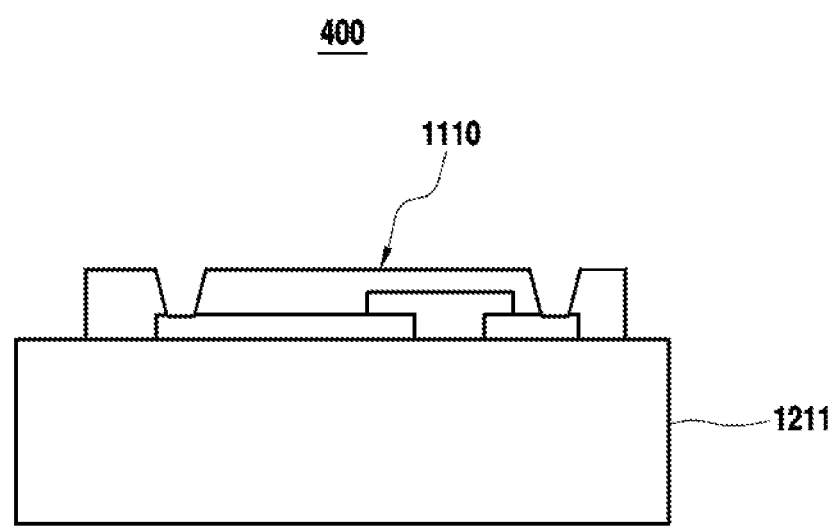
FIG. 13 illustrates a cross-sectional view of the device portion of the device substrate of the semiconductor device after debonding the device portion from release layer, according to the embodiment of FIG. 4.

Referring again to FIG. 1, method 100 can comprise activity 109 of debonding (e.g., mechanically) the device portion of the device substrate from the release layer. FIG. 13 illustrates a cross-sectional view of device portion 1211 of device substrate 808 of semiconductor device 400 after debonding device portion 1211 (FIG. 12) from release layer 402 (FIG. 12), according to the embodiment of FIG. 4.

Referring back to FIG. 1, in many embodiments, activity 109 can comprise an activity of applying a release force (e.g., a steady release force) to the device portion of the device substrate in excess of the device substrate-release layer adhesion strength to debond the device portion of the device substrate from the release layer. In many embodiments, the release force can be applied to the device portion by peeling the device portion of the device substrate (e.g., by hand) from the release layer. In these or other embodiments, the release force can be applied (or augmented) by inserting a blade under the device portion of the device substrate and pressing on the device portion in a direction away from the release layer.

Further, in these or other embodiments, activity 109 can comprise an activity of severing the device portion of the device substrate from the release layer, such as, for example, using any suitable cutting implement (e.g., a blade, a laser, etc.). The activity of severing the device portion of the device substrate from the release layer can be performed alternatively to or as part of the activity of applying the release force to the device portion of the device substrate.

In many embodiments, maintaining an angle of less than or equal to approximately 45 degrees between the device portion of the device substrate and the release layer when performing activity 109 can mitigate or prevent damage to the semiconductor element(s) at the device portion.

Notably, in many embodiments, the device substrate-carrier substrate adhesion strength is greater than the device substrate-release layer adhesion strength. Further, in these or other embodiments, the release layer-carrier substrate adhesion strength can be greater than the device substrate-release layer adhesion strength. Still, in other embodiments, the release layer-carrier substrate adhesion strength can be less than the device substrate-release layer adhesion strength.

Thus, as mentioned briefly above, performing activity 109 can separate the device portion of the device substrate (e.g., being bonded only to the release layer by the lower device substrate-release layer adhesion strength) from the non-device portion (e.g., being bonded to the carrier substrate by the higher device substrate-carrier substrate adhesion strength). Accordingly, the lower device substrate-release layer adhesion strength can be sufficiently low to permit the device portion of the device substrate to be debonded from the release layer using mechanical debonding alone once the device portion of the device substrate is separated from the non-device portion of the device substrate, which can remain bonded to the device substrate. Meanwhile, when the release layer-carrier substrate adhesion strength is greater than the device substrate-release layer adhesion strength, the release layer can remain bonded to the carrier substrate (e.g., as opposed to the device portion of the device substrate) as the device portion of the device substrate is debonded from the release layer.

Further, advantageously, in many embodiments, activity 109 can be performed without first lowering the device substrate-release layer adhesion strength, such as, for example, using chemical or optical debonding procedures (e.g., electronics on plastic by laser release (EPLaR™) surface free technology by laser annealing/ablation (SUFTLA™), etc.). That is, the device substrate-release layer adhesion strength can remain approximately constant, and in many examples, at least remain low enough to permit mechanical debonding, directly up until activity 109 is performed. Accordingly, by avoiding using chemical or optical debonding procedures (e.g., electronics on plastic by laser release (EPLaR™), surface free technology by laser annealing/ablation (SUFTLA™), etc.), device defects of the semiconductor element(s) and/or decreased semiconductor device yield that can result from using such chemical or optical debonding procedures can be reduced or eliminated. For example, optical debonding procedures can damage the semiconductor element(s) through heat distortion and/or formation of particulate debris. Meanwhile, chemical debonding procedures can damage the semiconductor element(s) by exposing the semiconductor element(s) to the chemical(s), resulting in degradation of the semiconductor element(s). Moreover, using chemical debonding procedures may require subsequent cleaning to remove any residual chemicals from the semiconductor element(s) and/or may not permit the device portion of the device substrate to be kept approximately flat during debonding because physically constraining the device portion while immersing the device portion in chemicals can be challenging.

As noted in part above, in many embodiments, such as, for example, when the release layer comprises PMMA, performing activity 106 and/or activity 107 above a temperature causing the release layer to transition into a non-solid material (e.g., approximately 235° C.) can cause the device substrate-release layer adhesion strength to increase substantially. Under these circumstances, it may not be possible to perform activity 109 without using chemical or optical debonding procedures (e.g., electronics on plastic by laser release (EPLaR™), surface free technology by laser annealing/ablation (SUFTLA™). Accordingly, in many embodiments, activity 106 and/or activity 107 can be performed below the temperature causing the release layer to transition into a non-solid material (e.g., approximately 235° C.).

In many embodiments, the adhesion strength of the device substrate-carrier substrate adhesion strength, the device substrate-release layer adhesion strength, and/or the release layer-carrier substrate adhesion strength can refer to a tensile adhesion strength and/or a peel adhesion strength.

In many examples, tensile adhesion strength can be measured by depositing and/or bonding a layer of a first test material (e.g., a material of the device substrate or the release layer) to a layer of a second test material (e.g., the material of the release layer or the carrier substrate, as applicable). In some of these examples, the layer of the first test material can be cured. Meanwhile, a test area of the layer of the first material can be bonded to a vertical force test instrument, such as, an MX-275 motorized vertical force test instrument manufactured by IMADA, Incorporated of Northbrook, Ill., United States of America. More specifically, the test area can be bonded to a test block of the vertical force test instrument. In many examples, the test area can comprise a 1 centimeter square area of the layer of the first test material, and/or the test area can be isolated (e.g., cut) from a remainder of the layer of the first material (e.g., with a razor blade). In further examples, a cyanoacrylate adhesive or polyurethane adhesive can be implemented to bond the test area to the test block. After the adhesive is allowed to cure (e.g., for 24 hours), the vertical force test instrument can be used with a force gauge to measure a peak force acting on the layer of the first material as the vertical force test instrument pulls on the test area. The force gauge can comprise a DS2-44 force gauge manufactured by IMADA, Incorporated of Northbrook, Ill., United States of America.

In further examples, peel adhesion strength can be measured by depositing and/or bonding a layer of a first test material (e.g., a material of the device substrate or the release layer) to a layer of a second test material (e.g., the material of the release layer or the carrier substrate, as applicable). In some of these examples, the layer of the first test material can be cured. A strip of the layer of the first material can be cut into the layer (e.g., with a razor blade). For example, the layer can be approximately 2.54 centimeters wide. After cutting out the strip, a portion of the strip at the edge of the layer of the first material can be released by mechanical means (e.g., by a razor blade) from the layer of the second material. The released portion can be clamped to a vertical force test instrument, and the vertical force test instrument can be used with a force gauge to determine a peak force acting on the strip of the layer of the first material as the vertical force test instrument pulls (e.g., continuously) on the strip. In many examples, the vertical force test instrument can comprise an MX-275 motorized vertical force test instrument manufactured by IMADA, Incorporated of Northbrook, Ill., United States of America, and/or the force gauge can comprise a DS2-44 force gauge manufactured by IMADA, Incorporated of Northbrook, Ill., United States of America.

With respect to tensile adhesion strength, in many embodiments, the device substrate-carrier substrate adhesion strength can be greater than or equal to approximately 0.5, 0.52, 0.54, 0.56, 0.58, or 0.6 MegaPascal, and/or the device substrate-release layer adhesion strength can be less than or equal to approximately 0.25, 0.26, 0.27, 0.28, 0.29, or 0.30 MegaPascal. Further, with respect to peel adhesion strength, in many embodiments, the device substrate-carrier substrate adhesion strength can be greater than or equal to approximately 78, 78.5, or 79 grams per centimeter.

Meanwhile, a first ratio of the device substrate-carrier substrate adhesion strength to the device substrate-release layer adhesion strength can be greater than or equal to approximately 2. In other embodiments, the first ratio can be greater then or equal to approximately 1.75, 1.5, or 1.25. Further, a second ratio of the device substrate-release layer adhesion strength to the release layer-carrier substrate adhesion strength can be less than or equal to approximately 0.5. In other embodiments, the second ratio can be less then or equal to approximately 0.675, 0.75, or 0.875. In many embodiments, the materials of the carrier substrate, the release layer, and/or the device substrate can comprise any suitable material(s) that satisfy the first and second ratios.

Further, method 100 can comprise activity 110 of cleaning the carrier substrate, such as, for example, to remove residual parts of the release layer, carrier layer, and/or semiconductor element(s) from the carrier layer remaining after performing activity 109. In some embodiments, activity 110 can comprise an activity of cleaning the carrier substrate with plasma (e.g., $O_2$ plasma). Accordingly, in many embodiments, method 100 can be repeated one or more times using the same carrier substrate.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that one or more activities of method 100 (FIG. 1) may be comprised of many different activities, procedures, and/or processes and may be performed by many different modules and in many different orders, that any elements of FIGS. 1-13 may be modified, and that the foregoing discussion of certain of these embodiments does not necessarily represent a complete description of all possible embodiments.

Generally, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
providing a carrier substrate;
providing a release layer over the carrier substrate, the release layer comprising polymethylmethacrylate; and
providing a device substrate over the carrier substrate and the release layer;
wherein:
providing the device substrate comprises:
bonding the device substrate to the carrier substrate, the device substrate bonding to the carrier substrate with a first adhesion strength; and
bonding the device substrate to the release layer, the device substrate bonding to the release layer with a second adhesion strength less than the first adhesion strength;
and
providing the release layer comprises bonding the release layer to the carrier substrate, the release layer bonding to the carrier substrate with a third adhesion strength greater than the second adhesion strength.

2. The method of claim 1 wherein at least one of:
bonding the device substrate to the carrier substrate comprises bonding the device substrate directly to the carrier substrate; or
bonding the release layer to the carrier substrate comprises bonding the release layer directly to the carrier substrate.

3. The method of claim 1 wherein at least one of:
providing the device substrate comprises curing the device substrate; or
providing the release layer comprises curing the release layer.

4. The method of claim 1 wherein at least one of:
bonding the device substrate to the carrier substrate comprises sealing the release layer between the device substrate and the carrier substrate; or
bonding the device substrate to the carrier substrate and bonding the device substrate to the release layer occur approximately simultaneously with each other.

5. The method of claim 1 wherein at least one of:
the carrier substrate comprises a rigid substrate; or
the device substrate comprises a flexible substrate.

6. The method of claim 1 wherein:
the carrier substrate comprises a rigid substrate; and
the rigid substrate is devoid of silicon.

7. The method of claim 1 wherein:
the device substrate comprises a flexible substrate; and
the flexible substrate comprises at least one of polyimide or polyamide.

8. The method of claim 1 wherein at least one of:
providing the release layer comprises depositing the release layer on the carrier substrate; or
providing the device substrate comprises:
depositing the device substrate on the carrier substrate; and
depositing the device substrate on the release layer.

9. The method of claim 1 wherein at least one of:
providing the release layer over the carrier substrate comprises providing the release layer such that the release layer comprises a first thickness, the first thickness being greater than or equal to approximately 0.1 micrometer and less than or equal to approximately 25 micrometers; or
providing the device substrate over the carrier substrate and the release layer comprises providing the device substrate such that the device substrate comprises a second thickness greater than or equal to approximately 1 micrometer and less than or equal to approximately 1 millimeter.

10. The method of claim 1 further comprising:
before providing the device substrate, performing an edge bead removal to remove a release layer edge portion of the release layer from over the carrier substrate.

11. The method of claim 1 wherein at least one of:
the second adhesion strength comprises a first tensile adhesion strength less than or equal to approximately 0.25 MegaPascal;
the first adhesion strength comprises a second tensile adhesion strength greater than or equal to approximately 0.50 MegaPascal;
the first adhesion strength comprises a peel adhesion strength greater than or equal to approximately 78.5 grams per centimeter;
a first ratio of the first adhesion strength to the second adhesion strength is greater than or equal to approximately 2; or
a second ratio of the second adhesion strength to the third adhesion strength is less than or equal to approximately 0.5.

12. The method of claim 1 further comprising:
after bonding the device substrate to the carrier substrate and after bonding the device substrate to the release layer, providing one or more semiconductor elements over the device substrate while the device substrate is bonded to the carrier substrate and the release layer.

13. The method of claim 12 further comprising:
after providing the one or more semiconductor elements over the device substrate, severing a first portion of the device substrate from a second portion of the device substrate, the second portion of the device substrate being bonded to the carrier substrate and the first portion of the device substrate being bonded to the release layer and not to the carrier substrate; and
after severing the first portion of the device substrate from the second portion of the device substrate, mechanically debonding the first portion of the device substrate from the release layer.

14. The method of claim 13 wherein:
mechanically debonding the first portion of the device substrate from the release layer occurs without lowering the second adhesion strength in order to perform the debonding.

15. A method comprising:
providing a carrier substrate;
providing a release layer over the carrier substrate, the release layer comprising polymethylmethacrylate; and
providing a device substrate over the carrier substrate and the release layer;
wherein:
providing the device substrate comprises:
bonding the device substrate to the carrier substrate, the device substrate bonding to the carrier substrate with a first adhesion strength; and
bonding the device substrate to the release layer, the device substrate bonding to the release layer with a second adhesion strength less than the first adhesion strength;
providing the release layer comprises bonding the release layer to the carrier substrate, the release layer bonding to the carrier substrate with a third adhesion strength greater than the second adhesion strength;

bonding the device substrate to the carrier substrate comprises bonding the device substrate directly to the carrier substrate;

bonding the release layer to the carrier substrate comprises bonding the release layer directly to the carrier substrate;

the carrier substrate comprises a rigid substrate;

the device substrate comprises a flexible substrate;

the flexible substrate comprises at least one of polyimide or polyamide; and the second adhesion strength comprises a tensile adhesion strength less than or equal to approximately 0.25 MegaPascal.

16. The method of claim 15 further comprising:

after bonding the device substrate to the carrier substrate and after bonding the device substrate to the release layer, providing one or more semiconductor elements over the device substrate while the device substrate is bonded to the carrier substrate and the release layer;

after providing the one or more semiconductor elements over the device substrate, severing a first portion of the device substrate from a second portion of the device substrate, the second portion of the device substrate being bonded to the carrier substrate and the first portion of the device substrate being bonded to the release layer and not to the carrier substrate; and after severing the first portion of the device substrate from the second portion of the device substrate, mechanically debonding the first portion of the device substrate from the release layer;

wherein:

mechanically debonding the first portion of the device substrate from the release layer occurs without lowering the second adhesion strength in order to perform the debonding and while the second portion of the device substrate remains bonded to the carrier substrate.

17. A system comprising:

a carrier substrate comprising a rigid substrate;

a release layer over the carrier substrate, the release layer comprising polymethylmethacrylate; and a device substrate over the carrier substrate and the release layer, the device substrate comprising a flexible substrate and the flexible substrate comprising at least one of polyimide or polyamide;

wherein:

the device substrate is bonded (a) to the carrier substrate with a first adhesion strength and (b) to the release layer with a second adhesion strength less than the first adhesion strength; and the release layer is bonded to the carrier substrate with a third adhesion strength greater than the second adhesion strength.

18. The system of claim 17 wherein:

the rigid substrate is devoid of silicon.

19. The system of claim 17 further comprising:

one or more semiconductor elements over the device substrate.

20. The system of claim 19 wherein:

the device substrate comprises a first portion of the device substrate and a second portion of the device substrate;

the second portion of the device substrate is bonded to the carrier substrate;

the first portion of the device substrate is separate from the second portion of the device substrate, and is bonded to the release layer and not to the carrier substrate; and the first portion of the device substrate comprises the one or more semiconductor elements.

* * * * *